(12) United States Patent
Iwata et al.

(10) Patent No.: US 7,439,809 B2
(45) Date of Patent: Oct. 21, 2008

(54) RADIO FREQUENCY POWER AMPLIFIER

(75) Inventors: Motoyoshi Iwata, Osaka (JP); Hiroyasu Takehara, Osaka (JP); Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 122 days.

(21) Appl. No.: 11/404,802

(22) Filed: Apr. 17, 2006

(65) Prior Publication Data

US 2006/0232341 A1    Oct. 19, 2006

(30) Foreign Application Priority Data

Apr. 19, 2005   (JP) .............................. 2005-120429

(51) Int. Cl.
*H03F 3/04* (2006.01)

(52) U.S. Cl. ..................... 330/296; 330/310; 330/133; 330/136

(58) Field of Classification Search ................. 330/296, 330/133, 136, 310

See application file for complete search history.

(56) References Cited

U.S. PATENT DOCUMENTS

| 6,744,321 | B2 * | 6/2004 | Noh et al. | 330/296 |
| 6,753,734 | B2 * | 6/2004 | Arell et al. | 330/296 |
| 6,806,775 | B2 * | 10/2004 | Abe | 330/297 |
| 6,990,323 | B2 * | 1/2006 | Prikhodko et al. | 455/126 |
| 7,242,252 | B2 * | 7/2007 | Taylor | 330/296 |
| 7,271,662 | B2 * | 9/2007 | Akamine et al. | 330/310 |

FOREIGN PATENT DOCUMENTS

JP         2003051720 A      2/2003

* cited by examiner

*Primary Examiner*—Patricia Nguyen
(74) *Attorney, Agent, or Firm*—Steptoe & Johnson LLP

(57) ABSTRACT

There are provided an RF power amplifier transistor (2), a bias supply circuit (51) which supplies a bias current to the base of the RF power amplifier transistor and a bias control circuit (52) connected between the base of the RF power amplifier transistor and bias supply circuit, and the bias control circuit is connected to the power supply (32) of the RF power amplifier transistor, thus realizing high efficiency of the RF power amplifier when the power level is low and improving the temperature characteristic of the power amplifier when the power level is low.

16 Claims, 9 Drawing Sheets

F I G. 1
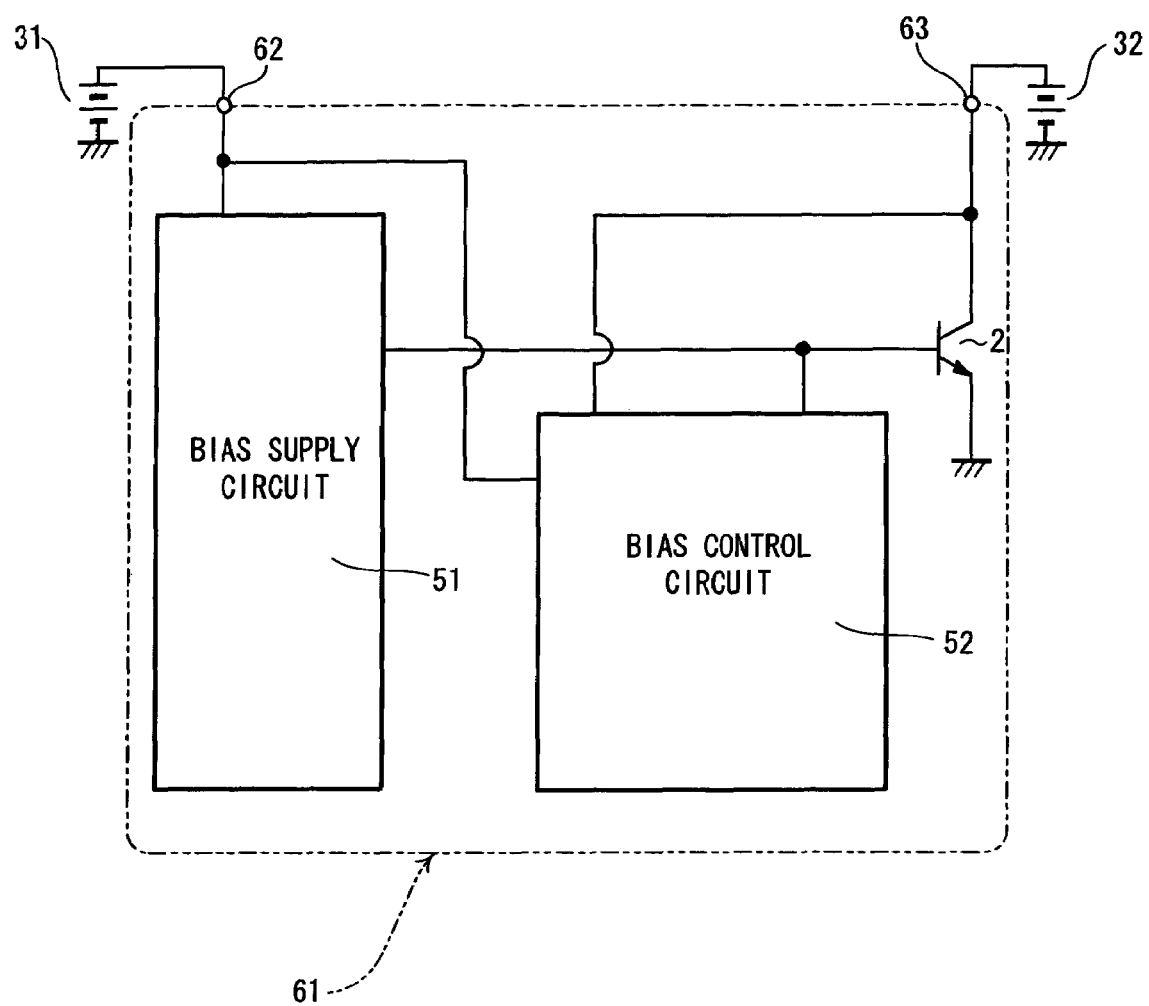

RADIO FREQUENCY POWER AMPLIFIER

FIELD OF THE INVENTION

The present invention relates to a power amplifier used for mobile communication equipment or the like, and more particularly, to reduction of current consumption during low output power.

BACKGROUND OF THE INVENTION

Mobile communication equipment represented by a cellular phone is rapidly advancing toward downsizing and extended talk time in recent years. For this reason, there is a strong demand for increasingly high efficiency in a transmission power amplifier which consumes a large portion of power during a call.

Especially, a recent communication system represented by CDMA (Code Division Multiple Access) has a so-called "power control function." This is the function that a terminal communicates with a base station with reduced transmission output when the terminal is located in a short distance from the base station.

At this time, the operation of the transmission power amplifier is switched from high output power (approximately 27.0 dBm) to low output power (approximately 13 dBm). During this low output power period, the transmission power amplifier operates within a range where sufficient linearity is obtained. This allows a bias point to be reduced (reducing an operating current) while maintaining linearity. Thus, there is a mobile communication terminal configured to achieve high efficiency as shown in FIG. 9.

In FIG. 9, reference numeral 1 denotes a bias supply transistor, 2 denotes a radio frequency power amplifier transistor, 11, 12, 13, 16 denote resistors, 14, 15 denote Schottky barrier diodes for temperature compensation, 31 denotes a Vctrl voltage which determines a base potential of the bias supply transistor 1 and 32 denotes a Vcc voltage which gives a potential to the collector of the power amplifier transistor 2. An idle current value of the collector of the power amplifier transistor 2 is determined by a base current generated by the Vctrl voltage 31, bias supply transistor 1, resistors 11, 12, 13, 16, Schottky barrier diodes 14, 15, and makes the Vctrl voltage 31 variable and controls a bias point of the RF power amplifier transistor 2.

FIG. 10 shows a circuit described in Japanese Patent Laid-Open No. 2003-51720, which newly adds a power control transistor 3 and resistors 21, 22 to the emitter of the bias supply transistor 1 and applies a power control voltage 33 to the base of the power control transistor 3 through the resistor 21 to improve controllability in FIG. 9. Applying the power control voltage 33 in this construction allows the idle current value of the collector of the power amplifier transistor 2 to be reduced in the low output power.

However, when the operating current of the RF power amplifier transistor 2 is controlled (restricted) by controlling the Vctrl voltage 31 in the low output power, the power amplifier bias circuit shown in FIG. 9 needs to control the Vctrl voltage 31 in hundred mV units (e.g., controlling it to 2.8 V to 2.7 V), resulting in a problem that control is difficult and a special circuit or a high accuracy external regulator is required. Furthermore, the circuit shown in FIG. 9 operates with the diodes 14, 15 compensating for the temperature characteristic of the RF power amplifier transistor 2, but when the operating current of the RF power amplifier transistor 2 is controlled (restricted) by the Vctrl voltage 31 in the low output power, the current flowing through the diodes 14, 15 reduces, which results in a problem that the temperature compensation effect is reduced.

Though a proposal to solve the above described problem is presented in the example shown in FIG. 10, it requires the power supply 33 for bias control in addition to the Vctrl power supply 31 and the power supply 32 of the RF power amplifier transistor 2, which requires complicated control. Furthermore, its efficiency improvement effect is solely based on bias control.

DISCLOSURE OF THE INVENTION

The present invention is intended to solve the above described problems and it is an object of the present invention to provide a radio frequency power amplifier which realizes a power amplifier with drastically improved efficiency in the low output power, with excellent controllability in current control (restrictions) and in a simple construction.

The RF power amplifier of the present invention is constructed to include an RF power amplifier transistor, a bias supply circuit for supplying a bias current to a base of the RF power amplifier transistor, and a bias control circuit connected between the base of the RF power amplifier transistor and the bias supply circuit, wherein the bias control circuit is constructed so as to control the bias current of the RF power amplifier transistor in accordance with a power supply voltage of the RF power amplifier transistor. This construction can drastically improve the efficiency in the low output power. Furthermore, the improved bias control circuit can realize a desired efficiency characteristic in the low output power. The improved bias control circuit can further add a temperature compensation function in the low output power and drastically improve the temperature characteristic of the power amplifier in the low output power.

Further, the bias control circuit includes a bias control transistor having a collector connected between the output of the bias supply circuit and the base of the RF power amplifier transistor, and an inverter transistor having a collector connected to the base of the bias control transistor, the base of the inverter transistor being connected to the power supply of the RF power amplifier transistor. According to this construction, the power supply voltage of the RF power amplifier transistor is reduced in the low output power, which causes the bias control transistor to function and can thereby reduce the operating current of the RF power amplifier transistor.

Furthermore, the bias control circuit includes a bias control transistor having a collector connected between the output of the bias supply circuit and the base of the RF power amplifier transistor, an inverter transistor having a collector connected to the base of the bias control transistor, and a transistor having an emitter connected to the base of the inverter transistor, the collector of the transistor being connected to the power supply of the RF power amplifier transistor to apply a power control signal to the base of the transistor. According to this construction, reducing the power supply voltage of the RF power amplifier transistor in the low output power causes the bias control transistor to operate, making it possible to reduce the operating current of the RF power amplifier transistor. Furthermore, the addition of the transistor for a reduction of current consumption can reduce current consumption of the bias control circuit.

Furthermore, the base and collector of the bias control transistor are connected via a resistor. According to this construction, it is possible to obtain arbitrary current dependency of the operating current with respect to the base terminal voltage of the bias control transistor by changing the resistor value.

Furthermore, the base and the emitter of the bias control transistor are connected via a resistor. According to this construction, it is possible to obtain arbitrary current dependency of the operating current with respect to the base terminal voltage of the bias control transistor by changing the resistor value.

Furthermore, the base and the collector of the bias control transistor are connected via a resistor, and the base and the emitter of the bias control transistor are connected via a resistor. According to this construction, it is possible to obtain arbitrary current dependency of the operating current with respect to the base terminal voltage of the bias control transistor by changing the resistor value.

Furthermore, a Schottky barrier diode or a PN-junction diode is connected in series to the emitter of the bias control transistor. When a voltage is applied to the base of the bias control transistor to reduce the current of the RF power amplifier transistor, this construction produces the effect that the PN-junction diode displays a temperature compensation function of compensating for a temperature characteristic variation of the power amplifier transistor. On the other hand, when the Schottky barrier diode is used instead of the PN-junction diode, the effect of displaying a stronger temperature compensation function is produced.

The present invention also provides a multi-stage RF power amplifier constructed in at least two stages, including at least one of the RF power amplifiers described above.

BRIEF DESCRIPTION OF THE DRAWINGS

FIG. 1 is a block diagram of an RF power amplifier of the present invention;

DESCRIPTION OF THE EMBODIMENTS

Embodiments of the present invention will be explained based on FIG. 1 to FIG. 8 below.

Embodiment 1

Figure 2A:
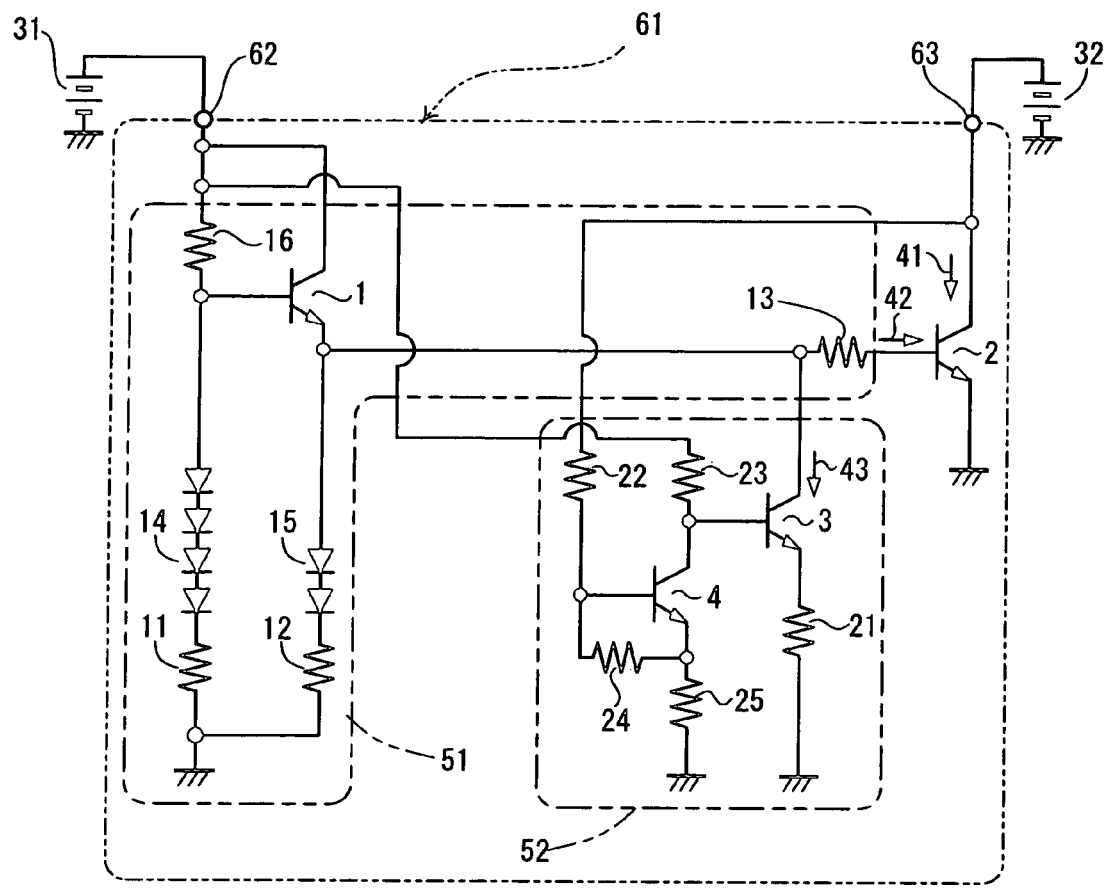
FIG. 2A and FIG. 2B show a circuit diagram of the RF power amplifier and a characteristic diagram showing the dependency of an idle current on a power supply voltage according to Embodiment 1 of the present invention.
Figure 2B:
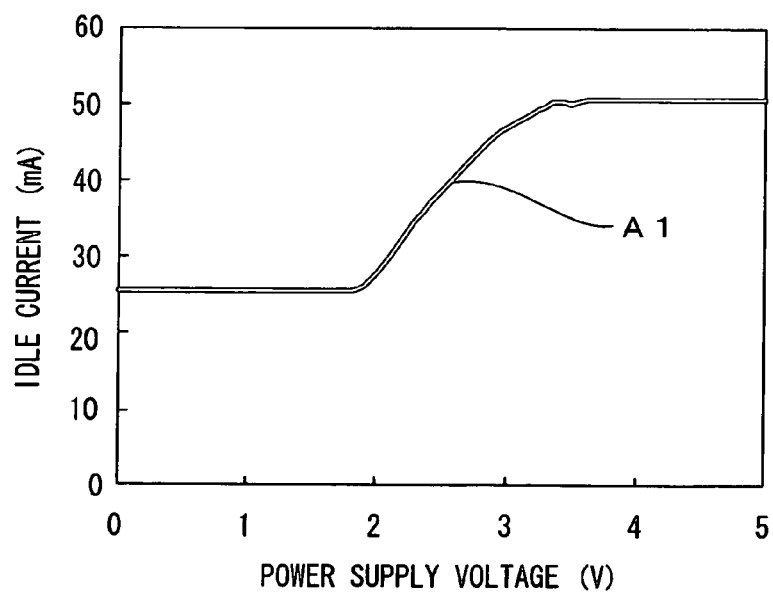

FIG. 1, FIG. 2A and FIG. 2B show Embodiment 1 of the present invention.

FIG. 1 shows the construction of an RF power amplifier 61 of Embodiment 1, which includes an RF power amplifier transistor 2, a bias supply circuit 51 and a bias control circuit 52. A Vctrl voltage 31 is applied to the bias supply circuit 51 through a Vctrl terminal 62 and a power supply voltage from a power supply 32 is applied to the collector of the RF power amplifier transistor 2 via a power supply voltage terminal 63. Furthermore, the power supply voltage from a power supply 32 is also applied to a control signal input of the bias control circuit 52.

FIG. 2A shows a specific circuit diagram thereof.

The collector of the RF power amplifier transistor 2 is connected to the power supply voltage terminal 63 and the emitter of the RF power amplifier transistor 2 is connected to a reference potential.

The bias supply circuit 51 is constructed by connecting a resistor 16, a Schottky barrier diode 14 for temperature compensation and a resistor 11 in series between the Vctrl terminal 62 and the reference potential, connecting the base of a bias supply transistor 1 to a connection point between the resistor 16 and diode 14, connecting a Schottky barrier diode 15 for temperature compensation and a resistor 12 in series between the emitter of the bias supply transistor 1 and the reference potential, connecting the collector of the bias supply transistor 1 to the Vctrl terminal 62 and connecting the emitter of the bias supply transistor 1 to the base of the RF power amplifier transistor 2 via a resistor 13.

The bias control circuit 52 includes a bias control transistor 3 and an inverter transistor 4 which inverts a control signal of the bias control transistor 3 and is constructed by connecting the collector of the bias control transistor 3 between the output of the bias supply circuit 51 and the base of the RF power amplifier transistor 2, and more specifically connecting the collector of the bias control transistor 3 to a connection point between the emitter of the bias supply transistor 1 and resistor 13, connecting the emitter of the bias control transistor 3 to the reference potential via a resistor 21, connecting the base of the bias control transistor 3 to a connection point between the collector of the inverter transistor 4 and a resistor 23, connecting the emitter of the inverter transistor 4 to the reference potential via a resistor 25, connecting the base and the emitter of the inverter transistor 4 via a resistor 24, connecting the base of the inverter transistor 4 to the power supply voltage terminal 63 via a resistor 22 and connecting a connection point between the base of the bias control transistor 3 and the collector of the inverter transistor 4 to the Vctrl terminal 62 via the resistor 23.

Reference numeral 41 denotes an idle current of the RF power amplifier transistor 2, 42 denotes a base current of the RF power amplifier transistor 2 and 43 denotes a collector current of the bias control transistor 3.

Power is supplied to the base of the inverter transistor 4 of the bias control circuit 52 from the power supply 32 via the resistor 22 and power is supplied to the base of the bias control transistor 3 from the Vctrl voltage 31 via the resistor 23.

In the RF power amplifier 61 of this Embodiment 1, the inverter transistor 4 is turned OFF by temporarily reducing the power supply voltage 32 in the low output power. When the inverter transistor 4 is turned OFF, the bias control transistor 3 is turned ON and the collector current 43 of the bias control transistor 3 flows. For this reason, the base current 42 of the RF power amplifier transistor 2 decreases, and as a result, the idle current 41 of the RF power amplifier transistor decreases.

FIG. 2B shows the dependency of the idle current 41 with respect to the power supply voltage 32 of the RF power amplifier transistor 2 with a solid line A1, the idle current 41 is high up to a point in the vicinity of which the power supply voltage 32 of the RF power amplifier transistor is approximately 3 V and then the current reduces from 3 V to close to 1 V and then the idle current stabilizes.

Controlling the power supply voltage 32 of the RF power amplifier transistor in this way allows the current control in the low output power, simultaneously realizes the effect of efficiency improvement through a reduction of the power supply voltage and efficiency improvement through bias control, and achieves drastic efficiency improvement of the RF power amplifier.

Embodiment 2

Figure 3A:
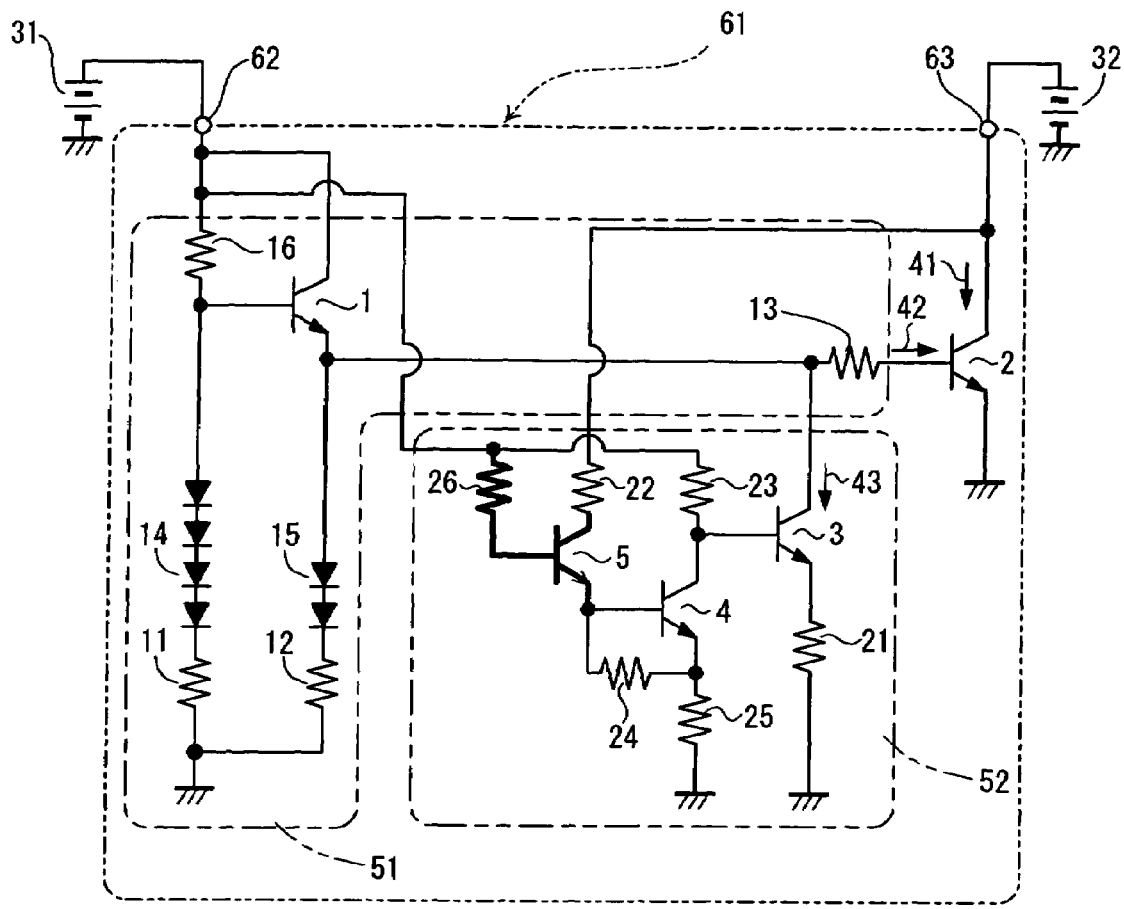
FIG. 3A and FIG. 3B show a circuit diagram of an RF power amplifier and a characteristic diagram showing the dependency of an idle current on a power supply voltage according to Embodiment 2 of the present invention.
Figure 3B:
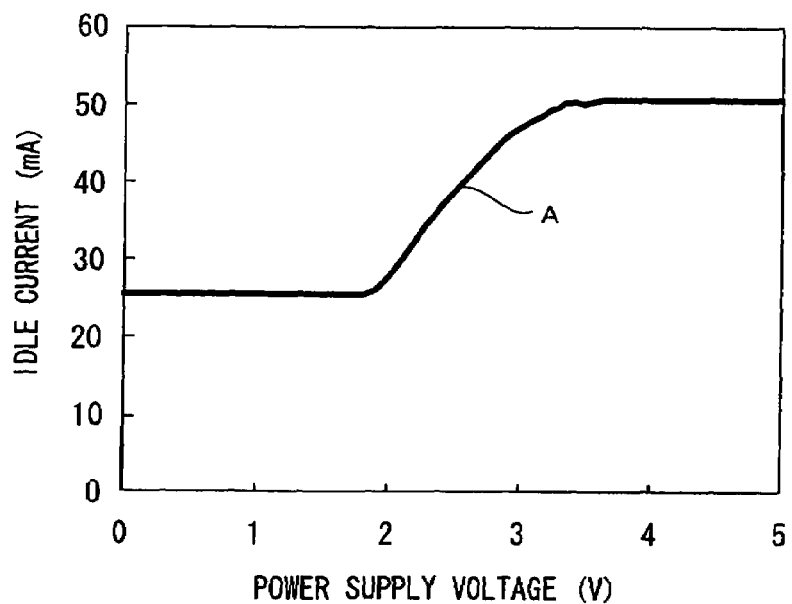

FIG. 3A and FIG. 3B show Embodiment 2 of the present invention, which is only different from FIG. 2A in that a transistor 5 for reducing current consumption of the bias control circuit is added to the base circuit of an inverter transistor 4 which forms part of a bias control circuit 52.

More specifically, the emitter of the transistor 5 is connected to the base of the inverter transistor 4, the collector is connected to the power supply of an RF power amplifier transistor 2 and the collector of the transistor 5 is connected to a power supply voltage terminal 63 via a resistor 22. The base of the transistor 5 is connected to a Vctrl terminal 62 to which a Vctrl voltage 31 as a power control signal is applied via a resistor 26.

According to this construction, as in the case of Embodiment 1 of the present invention, the inverter transistor 4 is turned OFF by reducing a power supply voltage 32 of the RF power amplifier transistor 2 in the low output power. When the inverter transistor 4 is turned OFF, a bias control transistor 3 is turned ON and a collector current 43 of the bias control transistor 3 flows. For this reason, a base current 42 of the RF power amplifier transistor 2 decreases, and as a result, an idle current 41 of the RF power amplifier transistor decreases.

FIG. 3B shows the dependency of the idle current 41 of the RF power amplifier transistor with respect to the power supply voltage 32 of the RF power amplifier transistor in Embodiment 2. It shows the dependency similar to that in FIG. 2B, and this Embodiment 2 can also perform current control in the low output power by controlling the power supply voltage of the RF power amplifier transistor, realize the effect of efficiency improvement through a reduction of the power supply voltage and the effect of efficiency improvement through bias control simultaneously and achieve drastic efficiency improvement of the RF power amplifier.

Furthermore, the effect of adding the transistor 5 and resistor 26 will be explained in contrast with the construction of Embodiment 1.

When the RF power amplifier is OFF, the RF power amplifier is kept to OFF by setting the Vctrl voltage 31 which determines the base potential of the bias supply transistor 1 to 0 V, but Embodiment 1 includes a path connected to a ground from the power supply voltage 32 of the RF power amplifier transistor 2 via the resistors 22, 24, 25 even when the Vctrl voltage 31 is set to 0 V, and when a current flows through this path, a standby current in the bias control circuit flows when the RF power amplifier is OFF. On the other hand, in Embodiment 2 which is additionally provided with the transistor 5 and resistor 26, the transistor 5 is added and therefore the transistor 5 turns OFF when Vctrl is 0 V, the path of the RF power amplifier transistor from the power supply voltage 32 to the ground is shut off and it is possible to eliminate the standby current of the bias control circuit when the RF power amplifier transistor is OFF and thereby reduce current consumption of the bias control circuit 52.

Embodiment 3

Figure 4A:
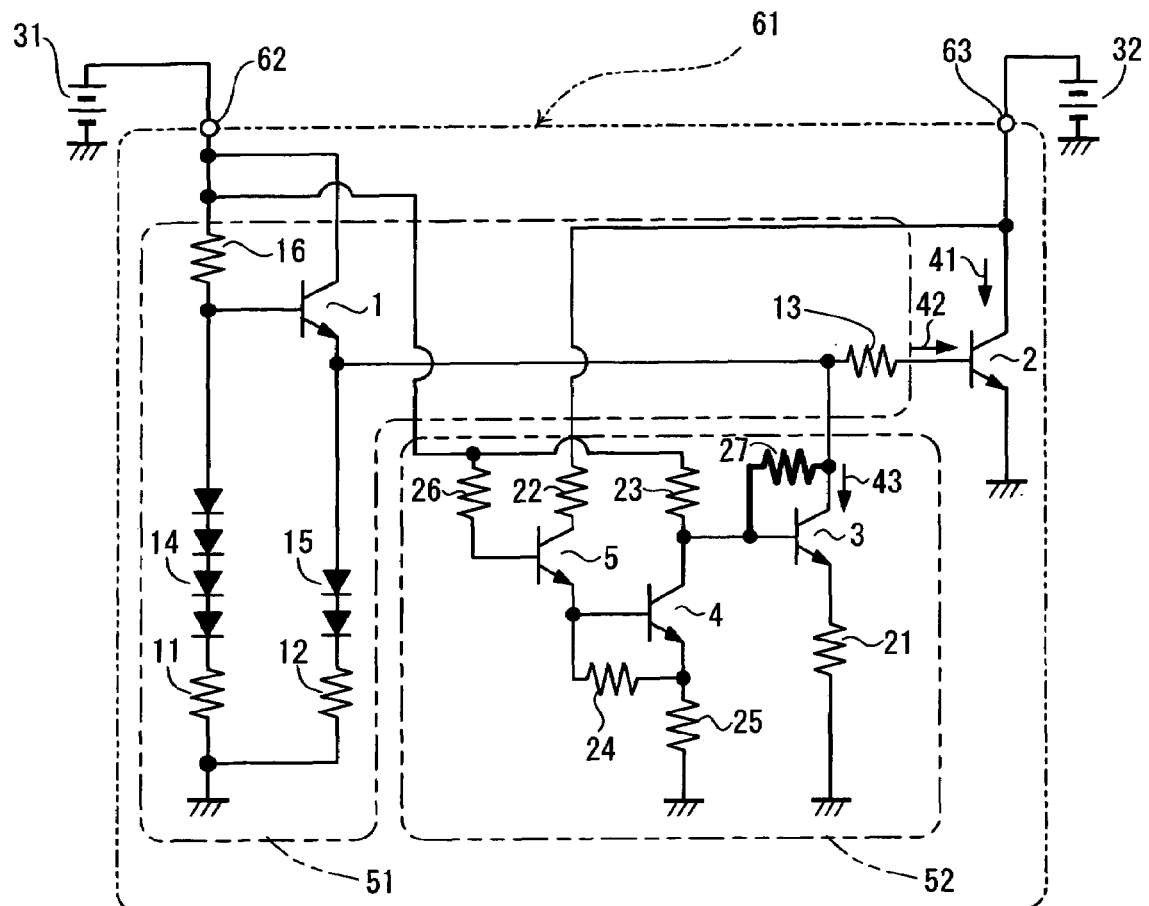
FIG. 4A and FIG. 4B show a circuit diagram of an RF power amplifier and a characteristic diagram showing the dependency of an idle current on a power supply voltage according to Embodiment 3 of the present invention.
Figure 4B:
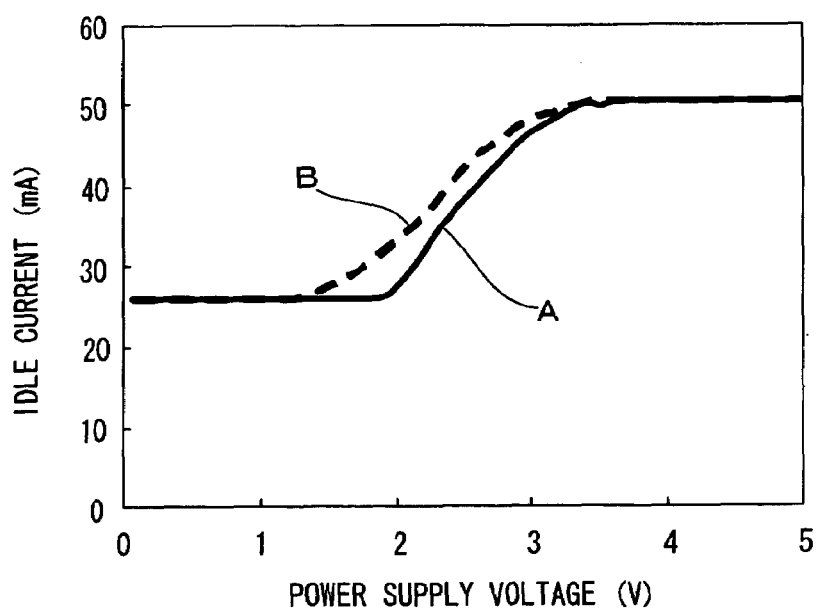

FIG. 4A and FIG. 4B show Embodiment 3 of the present invention, which is different from FIG. 3A only in that a resistor 27 is connected between the base and the collector of a bias control transistor 3 which forms part of a bias control circuit 52.

According to this construction, a variation of an idle current 41 of an RF power amplifier transistor 2 with respect to the base terminal voltage of the bias control transistor 3 can be controlled by changing the value of the resistor 27, and as a result it is possible to control the dependency of the idle current 41 with respect to a power supply voltage 32 of the RF power amplifier transistor. Therefore, the dependency of a desired idle current can be obtained by changing the value of the resistor 27.

Furthermore, the effect of adding the resistor 27 will be explained more specifically in contrast with the case of the construction in Embodiment 2.

In FIG. 4B, a solid line A shows the dependency of the idle current 41 with respect to the power supply voltage 32 in the case of Embodiment 2 and a dotted line B shows the dependency of the idle current 41 with respect to the power supply voltage 32 in the case of FIG. 4A.

As shown in this FIG. 4B, adding the resistor 27 makes the slope of the dependency of the idle current 41 with respect to the power supply voltage 32 gentler and this is because when the resistor 27 is added, if the bias control transistor 3 is ON, a voltage determined by a distribution ratio between the resistor 23 and resistor 27 is applied to the base of the bias control transistor 3. For this reason, the base voltage of the bias control transistor 3 changes more gently than when no resistor 27 is added. Furthermore, at this time, a voltage equal to or greater than the threshold of the transistor is applied to the base voltage of the RF power amplifier transistor 2 to which the resistor 27 is connected, and therefore the threshold voltage does not change. For this reason, as indicated by the dotted line B, the dependency of the idle current in FIG. 4B has a gentler slope than the solid line A.

This Embodiment 3 has explained the case where the resistor 27 is added to the construction of FIG. 3A as an example, but a similar effect can also be obtained even when the base and collector of the bias control transistor 3 in the construction of FIG. 2A are connected by the resistor 27.

Embodiment 4

Figure 5A:
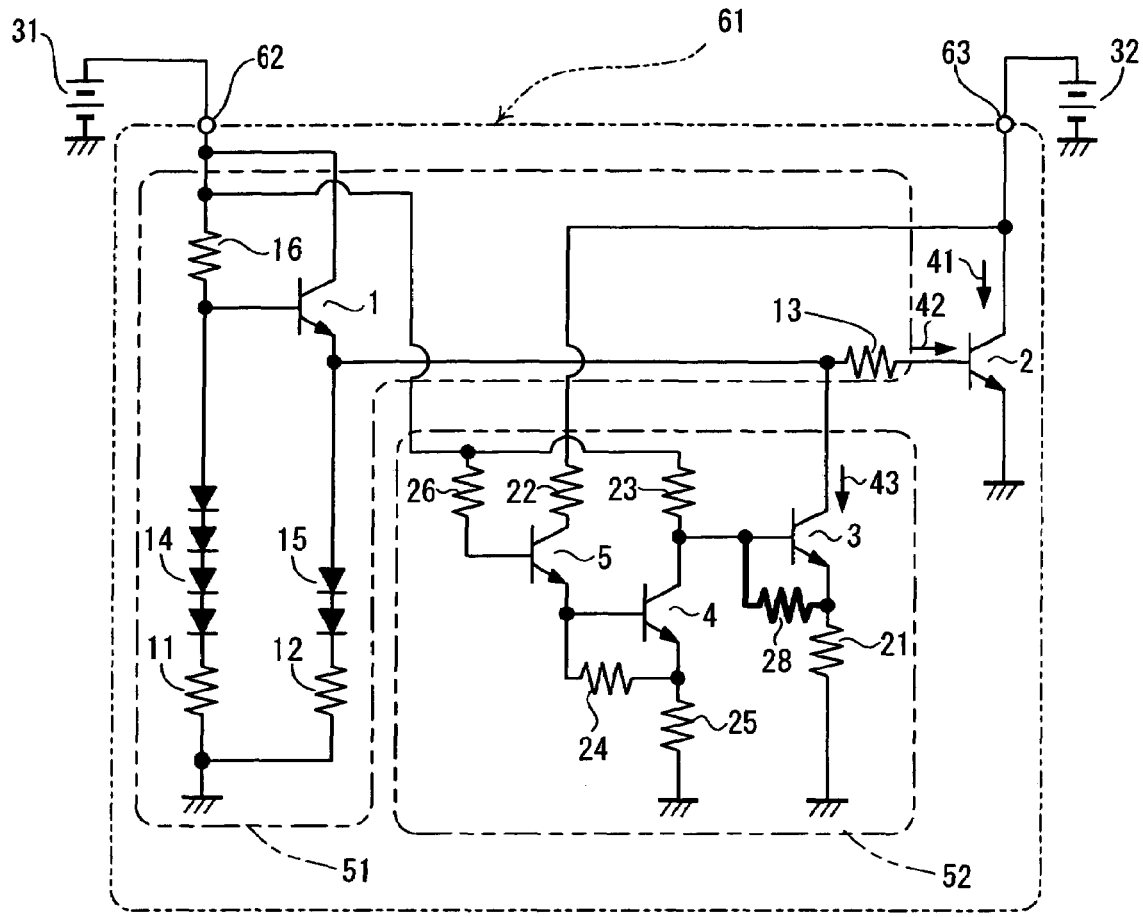
FIG. 5A and FIG. 5B show a circuit diagram of an RF power amplifier and a characteristic diagram showing the dependency of an idle current on a power supply voltage according to Embodiment 4 of the present invention.
Figure 5B:
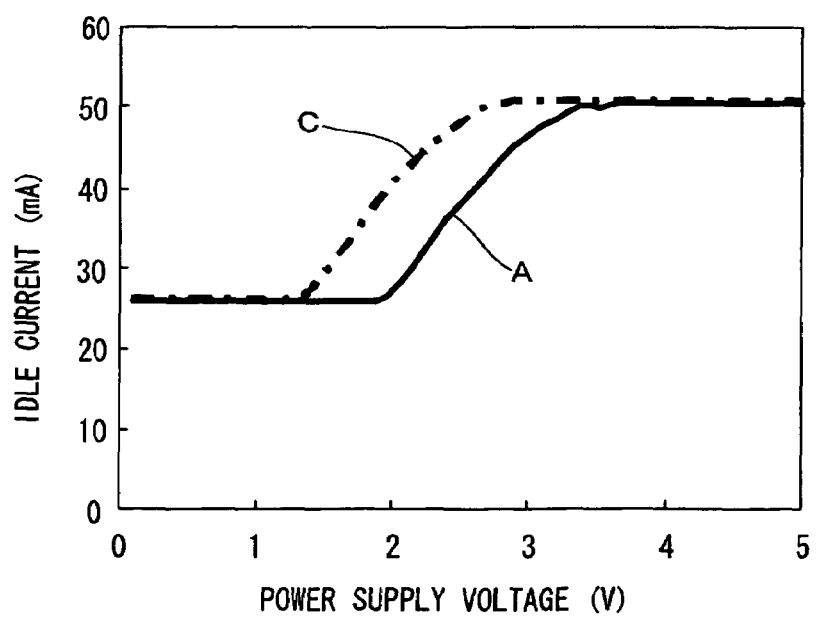

FIG. 5A and FIG. 5B show Embodiment 4 of the present invention, which is different from FIG. 3A only in that a resistor 28 is connected between the base and emitter of a bias control transistor 3 which forms part of a bias control circuit 52.

According to this construction, it is possible to control a variation of an idle current 41 of an RF power amplifier transistor 2 with respect to the base terminal voltage of the bias control transistor 3 by changing the value of the resistor 28 and control the dependency of the idle current 41 with respect to a power supply voltage 32 of the RF power amplifier transistor 2 consequently. Therefore, by changing the value of the resistor 28, it is possible to obtain the dependency of a desired idle current.

Furthermore, the effect of adding the resistor 28 will be explained more specifically in contrast with the case of the construction in Embodiment 2.

In FIG. 5B, a solid line A shows the dependency of the idle current 41 with respect to the power supply voltage 32 in the case of Embodiment 2 and a single-dot dashed line C shows the dependency of the idle current 41 with respect to the power supply voltage 32 in the case of FIG. 5A.

As shown in this FIG. 5B, adding the resistor 28 makes the slope of the dependency of the idle current 41 with respect to the power supply voltage 32 gentler and this is because when the resistor 28 is added, if the bias control transistor 3 is ON, a voltage determined by a voltage division ratio between the resistors 23, 28 and 21 is applied to the base of the bias control transistor 3. For this reason, the base voltage of the bias control transistor 3 is lower than that when no resistor 28 is added, and therefore the dependency of the idle current 41 with respect to the power supply voltage 32 is shifted toward the lower voltage side in parallel with the dependency A of Embodiment 2 as shown in FIG. 5B.

This Embodiment 4 has explained the case where the resistor 28 is added to the construction of FIG. 3A as an example, but a similar effect can also be obtained even when the base and emitter of the bias control transistor 3 in the construction of FIG. 2A are connected by the resistor 28.

Embodiment 5

Figure 6A:
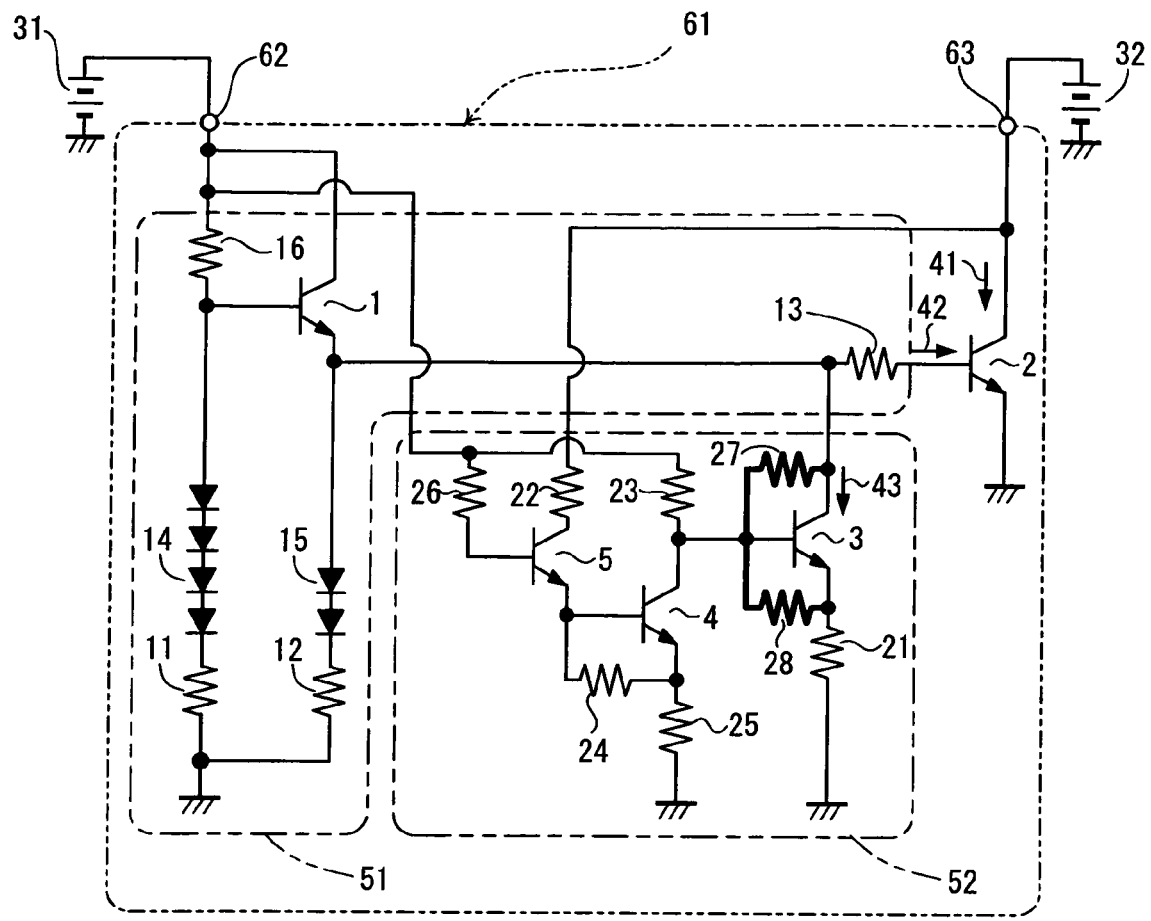
FIG. 6A and FIG. 6B show a circuit diagram of an RF power amplifier and a characteristic diagram showing the dependency of an idle current on a power supply voltage according to Embodiment 5 of the present invention.
Figure 6B:
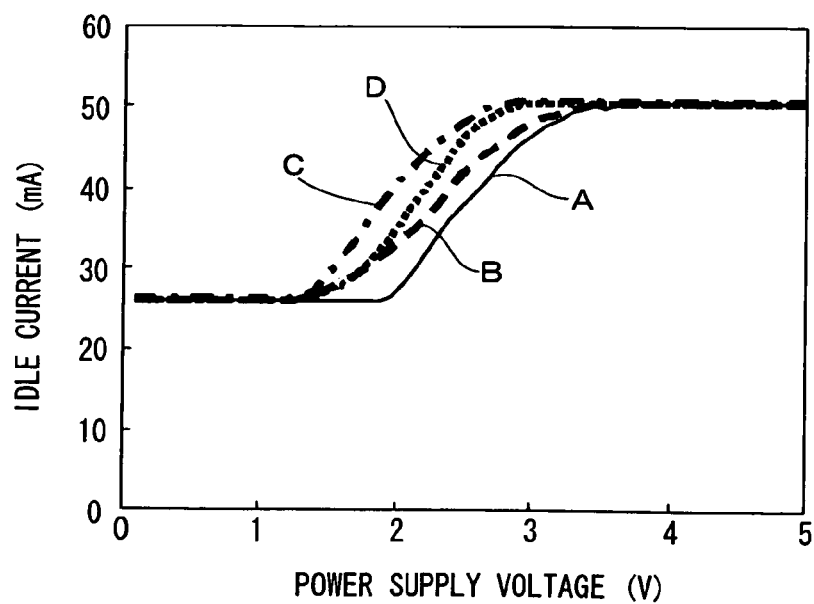

FIG. 6A and FIG. 6B show Embodiment 5 of the present invention, which is different from FIG. 3A only in that a resistor 27 is connected between the base and collector of a bias control transistor 3 which forms part of a bias control circuit 52 and a resistor 28 is further connected between the base and emitter of the bias control transistor 3.

According to this construction, it is possible to control a variation of an idle current 41 of an RF power amplifier transistor 2 with respect to the base terminal voltage of the bias control transistor 3 by changing the value of the resistors 27, 28 and control the dependency of the idle current 41 with respect to a power supply voltage 32 of the RF power amplifier transistor 2 consequently. Therefore, by changing the values of the resistors 27, 28, it is possible to obtain the dependency of a desired idle current.

Furthermore, the effect of adding the resistors 27, 28 will be explained more specifically in contrast with the cases of the constructions in Embodiment 2 and Embodiment 3.

In FIG. 6B, a solid line A, dotted line B and single-dot dashed line C show the dependency of the idle current 41 with respect to the power supply voltage 32 in the cases of Embodiment 2 to Embodiment 4 respectively, and dotted line D shows the dependency of the idle current 41 with respect to the power supply voltage 32 in the case of FIG. 6A.

As shown in this FIG. 6B, by adding the resistors 27, 28, it is possible to obtain an effect combining the effect in Embodiment 3 and effect in Embodiment 4 with the effect in Embodiment 2. Therefore, in this Embodiment 5, it is possible to realize the dependency of the idle current 41 with respect to the power supply voltage 32 of a higher degree of freedom.

This Embodiment 5 has explained the case where the resistors 27, 28 are added to the construction of FIG. 3A as an example, but a similar effect can also be obtained even when the base and collector, and the base and emitter of the bias control transistor 3 in the construction of FIG. 2A are connected by the resistors 27, 28 respectively.

Embodiment 6

Figure 7A:
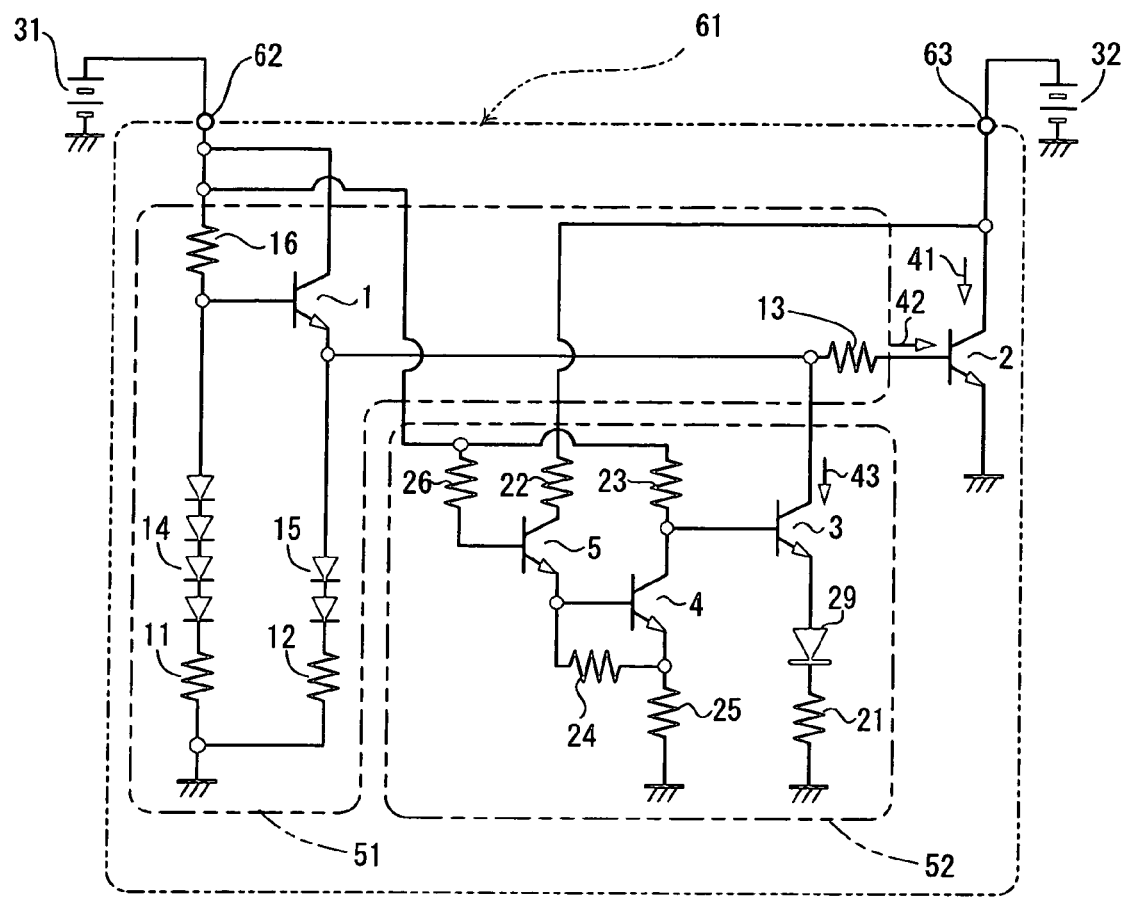
FIG. 7A and FIG. 7B show a circuit diagram of an RF power amplifier and a characteristic diagram showing the dependency of an idle current on a power supply voltage according to Embodiment 6 of the present invention.
Figure 7B:
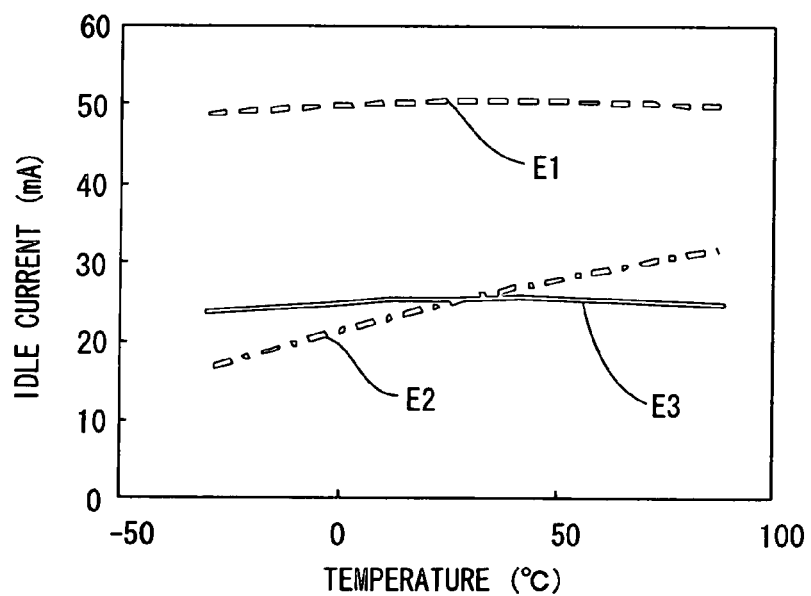

FIG. 7A and FIG. 7B show Embodiment 6 of the present invention, which is different from FIG. 3A only in that a Schottky diode 29 is connected in series to the emitter of a bias control transistor 3 which forms part of a bias control circuit 52.

According to this construction, when a power supply voltage 32 of an RF power amplifier transistor 2 is controlled to reduce an idle current 41, the Schottky barrier diode 29 functions so as to cancel out the temperature characteristic of the RF power amplifier transistor 2 producing the effect of reducing a temperature variation of the idle current 41.

In order to explain features of Embodiment 6, the temperature dependency of the idle current is shown in FIG. 7B. Here, a dotted line E1 shows the temperature dependency when the power supply voltage 32 in Embodiment 2 is high, that is, in the high output power, a single-dot dashed line E2 shows the temperature dependency in Embodiment 2 in the low output power and a solid line E3 shows the temperature dependency in Embodiment 6 in the low output power.

In the temperature dependency in the high output power shown by the dotted line E1, the temperature variation of the idle current 41 is reduced through a temperature compensation effect of the Schottky barrier diodes 14, 15 in the bias supply circuit 51 and the temperature compensation effect of the RF power amplifier transistor 2. However, in the low output power as indicated by the dotted line E2, the balance of the temperature compensation is lost and the idle current 41 tends to increase at a high temperature.

On the other hand, according to Embodiment 6 shown by the solid line E3, the Schottky barrier diode 29 functions so as to cancel out the temperature characteristic of the RF power amplifier transistor 2 in the low output power, and can thereby drastically improve the temperature variation of the idle current 41. Other effects are the same as those in Embodiment 2.

Here, the case where the Schottky barrier diode 29 is used has been explained as an example, but similar temperature compensation effects may also be obtained even when a PN-junction diode is connected in series to the emitter of the bias control transistor 3.

Here, the case where the Schottky barrier diode 29 is added to the construction of Embodiment 2 has been explained as an example, but similar temperature compensation effects may also be obtained even when a Schottky barrier diode or PN-junction diode is connected in series to the emitter of the bias control transistor 3 in FIG. 2A, FIG. 4A, FIG. 5A or FIG. 6A.

Embodiment 7

Figure 8:
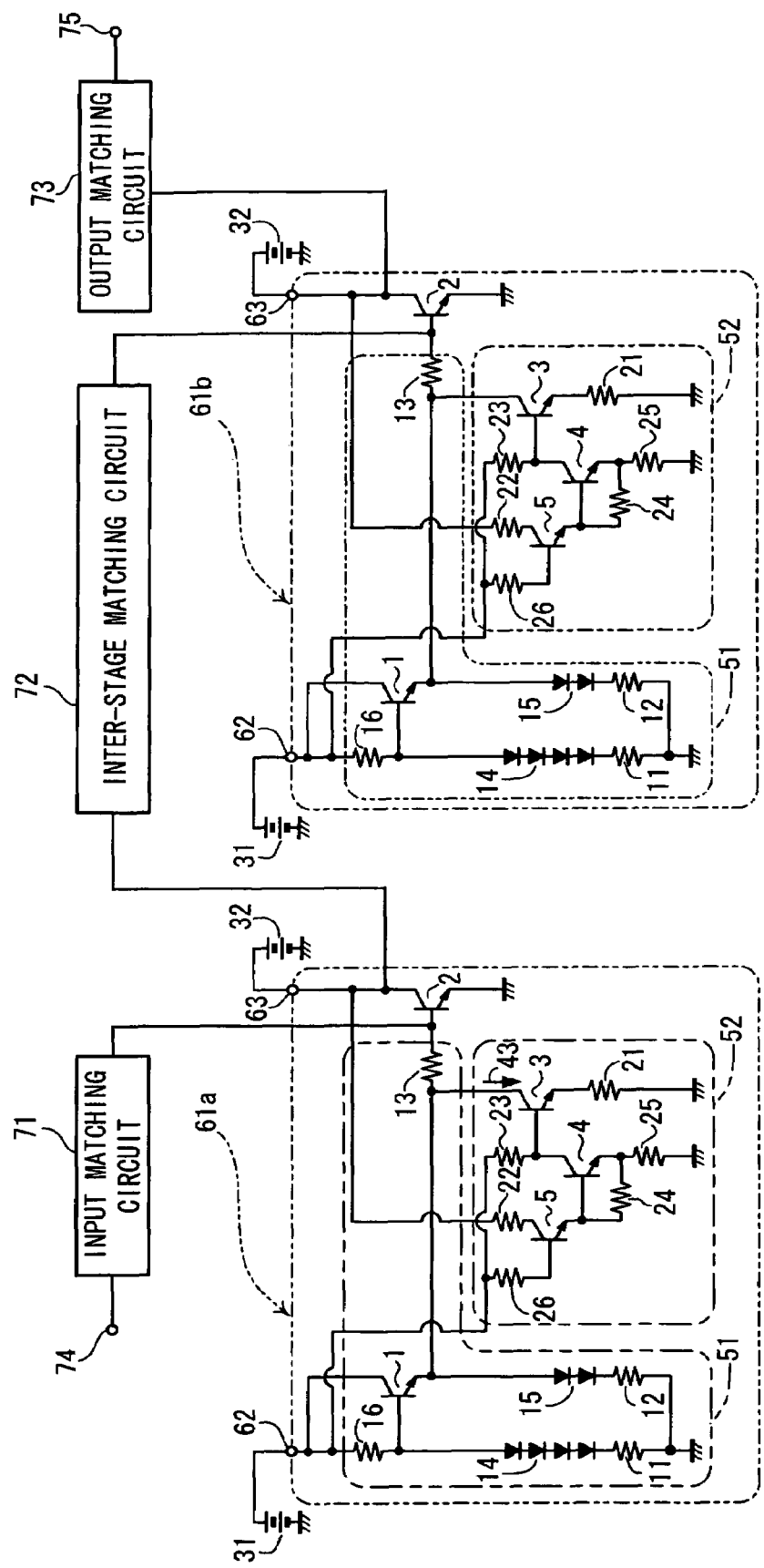
FIG. 8 is a circuit diagram of a multi-stage RF power amplifier according to Embodiment 7 of the present invention.
Figure 9:
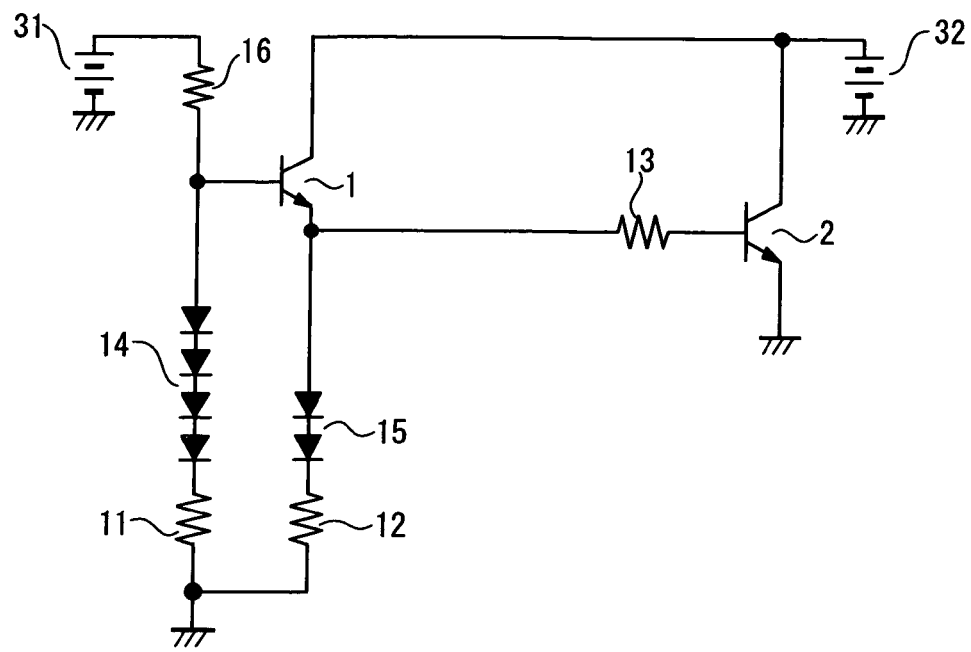
FIG. 9 is a circuit diagram of a conventional RF power amplifier.
Figure 10:
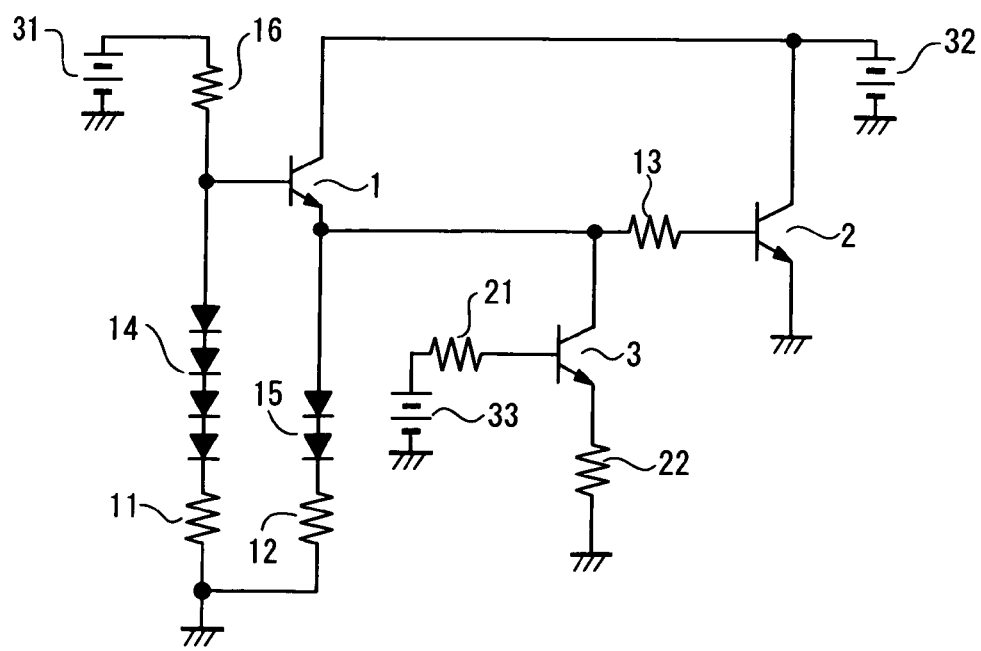
FIG. 10 is a circuit diagram of another conventional example.

FIG. 8 shows a multi-stage RF power amplifier made up of two RF power amplifiers according to Embodiment 2.

An RF signal inputted to an RF input terminal 74 is supplied to the base of an RF power amplifier transistor 2 of an RF power amplifier 61a in the first stage via an input matching circuit 71 and an RF signal generated at the collector of the RF power amplifier transistor 2 is supplied to the base of the RF power amplifier transistor 2 of an RF power amplifier 61b in the second stage via an inter-stage matching circuit 72, amplified and generated at the collector of the RF power amplifier transistor 2. This RF signal is outputted from an RF output terminal 75 via an output matching circuit 73.

Here, the circuit shown in FIG. 3A is used as the bias control circuit 52 of both the first and second RF power amplifiers 61*a*, 61*b*, and therefore it is possible to obtain a drastic efficiency improvement in the low output power.

Furthermore, such a multi-stage RF power amplifier is also applicable to Embodiment 1, Embodiment 3 to Embodiment 5 and similar effects can be obtained in such cases, too.

Furthermore, the circuit shown in FIG. 3A is used for both the first and second stages, but it is possible to optimize the characteristics of the RF power amplifier using the RF power amplifier of the present invention only for the first stage or using RF power amplifiers having different circuit constructions for the first and second stages.

The present invention can realize a reduction of current consumption of a mobile communication apparatus or various apparatuses mounted with this mobile communication apparatus as a communication unit and realize a communication which is stable for a long period of time even when a battery is used as the power supply.

What is claimed is:

1. A Radio Frequency (RF) power amplifier comprising:
    an RF power amplifier transistor;
    a bias supply circuit for supplying a bias current to a base of the RF power amplifier transistor; and
    a bias control circuit connected between the base of the RF power amplifier transistor and the bias supply circuit, wherein
    the bias control circuit is constructed to control the bias current of the RF power amplifier transistor in accordance with a power supply voltage of the RF power amplifier transistor, and
    the bias control circuit comprises a bias control transistor having a collector connected between the output of the bias supply circuit and the base of the RF power amplifier transistor, and an inverter transistor having a collector connected to the base of the bias control transistor, the base of the inverter transistor being connected to the power supply of the RF power amplifier transistor.

2. A Radio Frequency (RF) power amplifier comprising:
    an RF power amplifier transistor;
    a bias supply circuit for supplying a bias current to a base of the RF power amplifier transistor; and
    a bias control circuit connected between the base of the RF power amplifier transistor and the bias supply circuit, wherein
    the bias control circuit is constructed to control the bias current of the RF power amplifier transistor in accordance with a power supply voltage of the RF power amplifier transistor, and
    the bias control circuit comprises a bias control transistor having a collector connected between the output of the bias supply circuit and the base of the RF power amplifier transistor, an inverter transistor having a collector connected to the base of the bias control transistor, and a transistor having an emitter connected to the base of the inverter transistor, the collector of the transistor being connected to the power supply of the RF power amplifier transistor to apply a power control signal to the base of the transistor.

3. The RF power amplifier according to claim 1, wherein the base and the collector of the bias control transistor are connected via a resistor.

4. The RF power amplifier according to claim 2, wherein the base and the collector of the bias control transistor are connected via a resistor.

5. The RF power amplifier according to claim 1, wherein the base and the emitter of the bias control transistor are connected via a resistor.

6. The RF power amplifier according to claim 2, wherein the base and the emitter of the bias control transistor are connected via a resistor.

7. The RF power amplifier according to claim 1, wherein the base and the collector of the bias control transistor are connected via a resistor, and the base and the emitter of the bias control transistor are connected via a resistor.

8. The RF power amplifier according to claim 2, wherein the base and the collector of the bias control transistor are connected via a resistor, and the base and the emitter of the bias control transistor are connected via a resistor.

9. The RF power amplifier according to claim 1, wherein one of a Schottky barrier diode and a PN-junction diode is connected in series to the emitter of the bias control transistor.

10. The RF power amplifier according to claim 2, wherein one of a Schottky barrier diode and a PN-junction diode is connected in series to the emitter of the bias control transistor.

11. The RF power amplifier according to claim 3, wherein one of a Schottky barrier diode and a PN-junction diode is connected in series to the emitter of the bias control transistor.

12. The RF power amplifier according to claim 4, wherein one of a Schottky barrier diode and a PN-junction diode is connected in series to the emitter of the bias control transistor.

13. The RF power amplifier according to claim 5, wherein one of a Schottky barrier diode and a PN-junction diode is connected in series to the emitter of the bias control transistor.

14. The RF power amplifier according to claim 6, wherein one of a Schottky barrier diode and a PN-junction diode is connected in series to the emitter of the bias control transistor.

15. The RF power amplifier according to claim 7, wherein one of a Schottky barrier diode and a PN-junction diode is connected in series to the emitter of the bias control transistor.

16. The RF power amplifier according to claim 8, wherein one of a Schottky barrier diode and a PN-junction diode is connected in series to the emitter of the bias control transistor.

* * * * *